(12) United States Patent
Choi et al.

(10) Patent No.: US 11,990,940 B2
(45) Date of Patent: May 21, 2024

(54) SUBMINIATURE OPTICAL TRANSMISSION MODULE AND METHOD FOR MANUFACTURING SAME BY USING SEMICONDUCTOR PACKAGING SCHEME

(71) Applicant: LIPAC CO., LTD., Seoul (KR)

(72) Inventors: Seong Wook Choi, Seoul (KR); Young June Park, Seoul (KR)

(73) Assignee: LIPAC CO., LTD., Seoul (KR)

( * ) Notice: Subject to any disclaimer, the term of this patent is extended or adjusted under 35 U.S.C. 154(b) by 243 days.

(21) Appl. No.: 17/641,725

(22) PCT Filed: Sep. 21, 2020

(86) PCT No.: PCT/KR2020/012713
§ 371 (c)(1),
(2) Date: Mar. 9, 2022

(87) PCT Pub. No.: WO2021/054803
PCT Pub. Date: Mar. 25, 2021

(65) Prior Publication Data
US 2022/0321226 A1    Oct. 6, 2022

(30) Foreign Application Priority Data
Sep. 20, 2019  (KR) .......................... 10-2019-0115860

(51) Int. Cl.
*H04B 14/02*   (2006.01)
*G02B 6/42*    (2006.01)
(Continued)

(52) U.S. Cl.
CPC ......... *H04B 10/501* (2013.01); *G02B 6/4215* (2013.01); *G02B 6/4228* (2013.01); *H04J 14/02* (2013.01); *H04Q 2011/0032* (2013.01)

(58) Field of Classification Search
CPC   H04B 10/501; G02B 6/4215; G02B 6/12019; G02B 6/4219; H04J 14/02; H04Q 2011/0032; H01L 31/0203
See application file for complete search history.

(56) References Cited

U.S. PATENT DOCUMENTS 3,865,460 A  *  2/1975  Cherney ............... H01R 4/2433
                                                             439/404
10,011,098 B2 *  7/2018  Yu ........................... H01L 24/32
(Continued)

FOREIGN PATENT DOCUMENTS

KR      19990043121       6/1999
KR      20170051140       5/2017
(Continued)

OTHER PUBLICATIONS

International Search Report—PCT/KR2020/012713 dated Dec. 24, 2020.

*Primary Examiner* — Tanya T Motsinger
(74) *Attorney, Agent, or Firm* — CANTOR COLBURN LLP

(57) ABSTRACT

Provided are a subminiature optical transmission module and a method for manufacturing same. The optical transmission module includes: a mold body having a first surface and a second surface opposite to each other; multiple edge-type light emitting elements, each of which is molded inside the mold body by fitting same to the first surface so as to match with the first surface and generates an optical signal in the edge direction of a chip; and an optical component disposed on one side thereof so as to optically multiplex multiple optical signals incident from the multiple edge-type light emitting elements and to output same, wherein the identical height is configured between the surface of each light emitting element and the optical axis of (Continued)

the optical component, and the edge direction of the chip is parallel to the first surface of the mold body.

19 Claims, 8 Drawing Sheets

(51) Int. Cl.
    *H04B 10/50*       (2013.01)
    *H04J 14/02*       (2006.01)
    *H04Q 11/00*       (2006.01)

(56) References Cited

U.S. PATENT DOCUMENTS

| | | | | |
|---|---|---|---|---|
| 11,852,877 | B2* | 12/2023 | Choi | G02B 6/4228 |
| 11,862,600 | B2* | 1/2024 | Scharf | H01L 21/565 |
| 11,869,821 | B2* | 1/2024 | Ko | H01L 25/0652 |
| 2003/0095737 | A1* | 5/2003 | Welch | H01S 5/0683 |
| | | | | 385/14 |
| 2003/0118294 | A1* | 6/2003 | Korenaga | G02B 6/4246 |
| | | | | 385/52 |
| 2005/0201669 | A1 | 9/2005 | Welch et al. | |
| 2005/0249509 | A1* | 11/2005 | Nagarajan | H01S 5/12 |
| | | | | 398/198 |
| 2006/0001133 | A1* | 1/2006 | McGarvey | H01L 31/02325 |
| | | | | 257/E31.118 |
| 2017/0082485 | A1* | 3/2017 | Chiang | H01L 25/167 |
| 2018/0114744 | A1* | 4/2018 | Brandl | H01L 23/49541 |
| 2018/0337743 | A1* | 11/2018 | Jou | G02B 6/3652 |
| 2019/0199057 | A1* | 6/2019 | Wen | H01S 5/021 |
| 2020/0127156 | A1* | 4/2020 | Camarri | H01L 31/02325 |
| 2021/0218217 | A1* | 7/2021 | Tang | H04B 10/506 |
| 2022/0236500 | A1* | 7/2022 | Choi | G02B 6/4255 |
| 2022/0321226 | A1* | 10/2022 | Choi | H01L 31/167 |
| 2022/0328712 | A1* | 10/2022 | Song | H01L 31/12 |
| 2023/0043301 | A1* | 2/2023 | Okamoto | G01L 1/146 |
| 2023/0383188 | A1* | 11/2023 | Yagi | C08K 7/10 |
| 2024/0019649 | A1* | 1/2024 | Wilkerson | G02B 6/4274 |

FOREIGN PATENT DOCUMENTS

| | | |
|---|---|---|
| KR | 20180122311 | 11/2018 |
| KR | 20190007360 | 1/2019 |
| KR | 20200006655 | 1/2020 |

* cited by examiner

SUBMINIATURE OPTICAL TRANSMISSION MODULE AND METHOD FOR MANUFACTURING SAME BY USING SEMICONDUCTOR PACKAGING SCHEME

TECHNICAL FIELD

The present invention relates to an optical transmission module, and more particularly, to a subminiature optical transmission module and a method of manufacturing same, wherein optical alignment in x, y, and z directions between an edge-type light emitting element, an optical component, and an optical fiber from which light is emitted can be automated, thereby solving the problem of assembly difficulty.

BACKGROUND ART

In optical communication, data transmission capacity can be increased by expanding communication bandwidth or available channels or applying high-order modulation, but technology to speed up optical transceivers, especially optical devices and optical components, which are basically responsible for light transmission and reception functions, is important.

The increase in traffic due to the explosive increase in demand for large-capacity mobile services such as social network service (SNS) and videos has raised the need for network advancement. As a result, ultra-high-speed optical networking technology of 100 Gbps has been recently rapidly applied to optical links in data centers when compared to the existing 10 Gbps. As of 2019, about 50% or more of all data centers are occupied by 100 Gbps optical communication components.

Recently, data traffic has been increasing rapidly due to the fourth industry. In addition, there is a need for a network construction for preparing for 5G according to the general commercialization of 5G.

Multiplexing is a method of efficiently using limited communication resources, not separately transmitting low-speed data between two communication points, through divided channels, but transmitting multiple low-speed channels at high speed through one transmission path.

These multiplexing technologies have many advantages such as reducing investment costs in transmission facilities, maximizing communication link efficiency, and simplifying communication line facilities, so they can be actively used to build 5G networks.

The multiplexing optical network requires a multiplexer (MUX) that combines multiple transport streams into a single stream at both ends of the network, and a demultiplexer (DEMUX) that separates a combined single stream into respective elements and then delivers the same to corresponding receivers.

There are several multiplexing ways such as Time Division Multiplexing (TDM), Frequency Division Multiplexing (FDM), Code Division Multiplexing (CDM), and Wavelength Division Multiplexing (WDM), etc. Among them, WDM simultaneously transmits signals in several frequency bands using a wide frequency domain of optical fibers in a scheme of using frequency characteristics of optical signals.

In other words, WDM refers to an optical transmission method that simultaneously transmits multiple light wavelengths, and transmits information by multiplexing multiple wavelengths on one optical fiber and demultiplexing them again.

WDM is divided into coarse wavelength division multiplexing (CWDM), dense wavelength division multiplexing (DWDM), and short-wave wavelength division multiplexing (SWDM) according to wavelength spacing and band.

When a certain section of an optical line is saturated, a new optical cable should be laid in the case of the existing optical communication method, and the introduction of the WDM transmission method may reduce costs by allowing multiple channels of optical signals to be transmitted through only one optical line without the need to newly build an optical line. The single mode optical line itself has infinite bandwidth, making it very easy to increase network capacity.

An optical transceiver is a device that exchanges data while playing a role of transforming electrical signals into light signals and light signals into electrical signals between optical cables connecting optical communication networks and transmission equipment responsible for data transmission.

Optical links in data centers mainly use 100G CWDM4 QSFP+ standard optical transceivers with a transmission distance of 2 km and a transmission speed of 100 gigabits per second.

Arrayed Waveguide Grating (AWG) is a key component that enables WDM technology, and AWG for data centers and 5G has been used. In addition, according to the trend of high integration and miniaturization of transmission/reception optical modules in data centers, AWG is used to enable parts such as Transmitter Optical Sub-Assembly (TOSA) and Receiver Optical Sub-Assembly (ROSA) inside a 100G-class transmission/reception optical transceiver to perform MUX and DMUX functions, respectively.

MUX is a device that combines and separates optical signals so that various services such as 3G, LTE, 5G or the like can be transmitted and received in a single line. Therefore, when MUX equipment is introduced, a 5G network construction is possible in a plug-in scheme without installing an additional optical cable, and the existing optical cable network structure can be used without changing the structure of the existing optical cable network, to enable a quick construction of a network, and a 5G network can be constructed wherever the optical cable is installed.

The optical transmission module (such as TOSA) is usually used to transmit data at high speed. The optical transmission module (such as TOSA) includes hardware for converting an electrical signal into an optical signal and modulating/synthesizing the optical signal. The optical transmission module (such as TOSA) essentially includes a light source (light emitting element) for generating light and an optical component for modulating/synthesizing light.

In general, the optical transmission module (such as TOSA) requires precise optical alignment for optical transmission between the light emitting element, the optical component, and the optical fiber fastening component, and may use additional optical systems (lenses, reflective surfaces, etc.) to overcome the limitations of precision through simple assembly.

The optical transmission module (such as TOSA) is a key component required to convert an electrical signal into an optical signal for an optical communication system. Optical communication systems are often used to transmit data in a variety of systems, such as telecommunication systems and data communication systems. The electrical telecommunication systems often involve the transmission of data over a wide geographical distance ranging from a few miles to thousands of miles. The data communication systems often involve the transmission of data through a data center. Such systems include the transmission of data over distances ranging from a few meters to hundreds of meters.

In general, short-distance optical communication within 300 m is implemented using a multimode vertical-cavity surface-emitting laser (VCSEL) as a light emitting element, but VCSEL cannot transmit long-distance.

A backbone of an optical network that requires long-distance transmission of large amounts of data over 300 m to several tens of km, or an optical transmission module (such as TOSA) of a 100G-class optical transceiver that is employed within a data center requires performing a wavelength multiplexer (WDM MUX) function for collecting signals of four channels having different wavelengths (frequencies) and transmitting them to one optical fiber.

The wavelength multiplexer (WDM MUX) requires alignment of four edge-type light emitting devices in a single mode capable of long-distance transmission and AWG having a single-mode waveguide for WDM transmission.

Korean Patent Publication No. 10-2020-0006655 (Patent Document 1) discloses an optical transmission module comprising: a plurality of light sources outputting optical signals; an optical multiplexer for multiplexing the optical signals output from the plurality of light sources; a collimating lens for converting the optical signal output from the optical multiplexer into a parallel beam; a package in which the plurality of light sources, the optical multiplexer, and the collimating lens are embedded; and an optical isolator which is arranged in one surface of the inside of the package and isolates the optical signal reflected and returned from the outside of the optical transmission module, wherein the optical signals output from the plurality of light sources are multiplexed into an optical signal through the optical multiplexer arranged inside the package, and which are photocoupled to an optical fiber stub in a receptacle through an optical coupling lens arranged outside the package to be output to the outside, after passing through the collimating lens.

Patent Document 1 has a disadvantage of being very bulky because light sources, optical multiplexers, lenses, etc. are dispersed and assembled inside a package in the form of an enclosure.

DISCLOSURE

Technical Problem

In order to manufacture an optical transmission module (such as TOSA), precise optical alignment is required for optical signal transmission between components of the optical transmission module. In this process, the assembly cost increases, and in particular, alignment between the light emitting elements and the optical components has the highest assembly difficulty, which is a major cause of the increase in assembly cost.

In particular, for alignment of an edge type light emitting element in which light is emitted in the edge direction of a chip capable of long-distance transmission and an arrayed waveguide grating (AWG) having a single mode waveguide, alignment of sub-micron units should be performed in all x, y, and z directions. However, in the x and y directions, alignment of sub-micron units between the edge light emitting element and the AWG can be performed through precise pick and place equipment, but in the z direction, there is a tolerance of a micron or more in the height of each element itself, and the height of the light emitting spot of the edge light emitting element itself is different from the height of the core of the AWG, so the optical alignment problem cannot be solved with only the simple precise place of the chip.

In addition, the optical transmission module should be able to effectively connect electrical signals to the outside regardless of whether a control integrated circuit (IC) is included. In this case, conventional technology usually uses wire bonding, and for high-speed signal transmission, wire bonding may cause loss of signal integrity.

In addition, the optical transmission module needs to be miniaturized and integrated. This is because footprints and heights themselves should be reduced for communication on boards and communication on semiconductor chip packages, and miniaturization is essential for optical communication between consumer devices such as TVs and virtual reality (VR). Therefore, the size of the optical transmission module itself should be miniaturized, and it is necessary to integrate necessary ICs and the like.

To solve the above problems, the present invention provide a subminiature optical transmission module and a method of manufacturing the same, which can completely solve a height tolerance due to an inter-device wiring by packaging the optical transmission module by using a Fan Out Wafer Level Packaging (FOWLP) scheme so as to solve assembly difficulty by automating optical alignment in all directions of x, y, and z directions between an edge type light emitting element which emits light in an edge direction of a chip, an optical component, and an optical fiber.

The present invention provides a subminiature optical transmission module having a simple structure in which an assembly of the optical transmission module, an optical fiber, and an optical component may be coupled to a minimum number of components through a minimum number of assembly processes, and a manufacturing method thereof.

The present invention provides a subminiature optical transmission module capable of integrating various electrical elements as well as an optical element in the form of a system-in-package (SiP) type, into the optical transmission module, and miniaturizing the size of the optical transmission module. and a manufacturing method thereof using a semiconductor packaging scheme.

TECHNICAL SOLUTION

An optical transmission module according to an embodiment of the present invention, includes: a mold body having a first surface and a second surface opposite to each other; a plurality of edge-type light emitting elements, each of which is molded inside the mold body by fitting same to the first surface so as to match with the first surface and generates an optical signal in the edge direction of a chip; and an optical component disposed on one side thereof so as to optically multiplex a plurality of optical signals incident from the plurality of edge-type light emitting elements and to output same.

In this case, the height between the surface of each of the light emitting elements and the optical axis of the optical component is set to be the same, and the edge direction of the chip is parallel to the first surface of the mold body.

The optical component includes an arrayed waveguide grating (AWG) which includes, on one side thereof, a plurality of input waveguides corresponding to the plurality of edge-type light emitting elements, and optically multiplexes a plurality of optical signals incident through the plurality of input waveguides and outputs same through an output waveguide, and the optical axis height of each of the light emitting elements is set to be the same as the core of each of the input waveguides.

In addition, the AWG includes: an optical multiplexer unit that performs an optical multiplexing function; the plurality of input waveguides connected to the front end of the optical multiplexer unit and to which the plurality of optical signals incident from the plurality of light emitting elements are input; and a single mode output waveguide that is connected to the rear end of the optical multiplexer unit and outputs one optical signal output after a plurality of optical signals are multiplexed.

Further, the plurality of input waveguides of the AWG, may further include a wiring layer molded inside the first surface of the mold body with no top cladding and formed of an insulating material on the first surface of the mold body including the upper parts of the cores of the plurality of input waveguides, thereby serving as a top cladding to the plurality of input waveguides.

The wiring layer formed in a top cladding portion of each of the input waveguides is preferably formed by using a material having a refractive index lower than those of the cores of the input waveguides.

An optical transmission module according to an embodiment of the present invention, may further include: a wiring layer formed of an insulating material on the first surface of the mold body; a wiring metal which is formed inside and outside the wiring layer and connects the light emitting elements encapsulated in the mold body to the outside; and an external connection terminal exposed on the surface of the wiring layer and connected to the light emitting elements encapsulated inside the wiring metal or the mold body.

The external connection terminal may be in the form of a ball grid array using a wire-bonding pad or a solder ball.

An optical transmission module according to an embodiment of the present invention, may further include: a plurality of monitor photodiodes which are embedded at the rear end of the plurality of light emitting elements and generate detection signals for determining whether the optical transmission module fails by monitoring an amount of light generated when the light emitting elements operate.

The optical component may perform a wavelength multiplexer (WDM MUX) function for collecting signals of a plurality of channels having different wavelengths and transmitting the collected signals to one optical fiber.

An optical transmission module according to an embodiment of the present invention, includes: a mold body having a first surface and a second surface opposite to each other; a plurality of edge-type light emitting elements, each of which is molded inside the first surface of the mold body and generates an optical signal in the edge direction of a chip; an arrayed waveguide grating (AWG) which is molded in the first surface of the mold body and includes, on one side thereof, a plurality of input waveguides corresponding to the plurality of edge-type light emitting elements, and optically multiplexes a plurality of optical signals incident through the plurality of input waveguides and outputs same through an output waveguide, and a wiring layer formed of an insulating material on the first surface of the mold body, wherein the AWG is molded inside the first surface of the mold body without top cladding with the input waveguide, and the wiring layer is formed of the insulating material on the first surface of the mold body including the upper parts of the cores of a plurality of input waveguides, thereby serving as top cladding to the input waveguides.

The plurality of edge-type light emitting elements are distributed feedback lasers (DFB lasers), the optical axis height of each of the DFB lasers is set to be the same as the core of each of the input waveguides, and the edge direction of a DFB laser chip is parallel to the first surface of the mold body.

An optical transmission module according to an embodiment of the present invention, may further include: an optical fiber assembly guide formed to correspond to the output waveguide on the first surface of the mold body and to mount an optical fiber.

In addition, an optical transmission module according to an embodiment of the present invention, may further include: an external connection terminal formed on the second surface of the mold body and electrically connected to the outside; and a vertical conductive path formed through the mold body and electrically connected to the external connection terminal, wherein the vertical conductive path is connected to each of the light emitting elements through the wiring layer.

An optical transmission module according to an embodiment of the present invention, may further include: an optical fiber block coupled to one end of the optical transmission module in correspondence to the output waveguide and accommodating the optical fiber, wherein the optical fiber block aligns the optical fibers by using the wiring layer to correspond to the output waveguide.

An optical transmission module according to an embodiment of the present invention, may remove height tolerance caused by wiring between the elements by using a fan out wafer level packaging (FOWLP) scheme.

A method for manufacturing an optical transmission module according to the present invention may include attaching a light emitting element and an arrayed waveguide grating (AWG) that is not formed by a top cladding of an input waveguide so as to match the height of the optical axis of the AWG with that of the light emitting element to predetermined positions on a carrier on which an adhesive is applied; forming a molding layer on top of a carrier with an epoxy mold compound (EMC) and flattening the surface after curing; after performing a chemical mechanical polishing (CMP) process on the upper surface of the cured mold, obtaining a mold body having a first surface and a second surface facing each other by separating the cured mold and the carrier; exposing the first surface in which a terminal pad of the light emitting element and a core of an input waveguide of the AWG are located by inverting the mold body; and forming a wiring layer made of an insulating material on the first surface of the mold body, wherein the wiring layer formed on top of the core of the input waveguide uses a material having a lower refractive index than the core of the input waveguide to serve as the top cladding of the input waveguide.

The height of the light emitting spot of the light emitting element is set to the same height as the core of the input waveguide.

A method for manufacturing an optical transmission module according to the present invention may further include forming an external connection terminal connected to the light emitting element through the wiring layer and formed on the first or second surface of the mold body to be electrically connected to the outside.

In addition, a method for manufacturing an optical transmission module according to the present invention may further include: etching the front end of an output waveguide of the AWG to form an optical fiber storage space; and forming an optical fiber assembly guide capable of inserting an optical fiber into one side of an optical transmission module package by wafer sawing the lower end of an optical fiber accommodating space in an optical transmission module wafer.

ADVANTAGEOUS EFFECTS

In general, optical transceivers that enable high-speed transmission of tens of giga (G) to 100 G or more are required to include small and slim optical interface connectors with a thickness of 1 mm, and are required to satisfy reasonable manufacturing costs.

In particular, in order to manufacture a 100 G-class optical transmission module (such as TOSA), between an edge-type light emitting element (e.g., a DFB laser) that emits light in an edge direction of a chip as an optical element, an Arrayed Sinusoidal Waveguide Grating (AWG) for multiplexing, for example, four channels of light into one, and an optical fiber, misalignment should not occur while using passive alignment.

In order to align the edge-type light emitting element and the AWG, alignment in sub-micron units should be performed in all three-dimensional directions of x, y, and z, and in the present invention, the optical alignment of the x, y, and z directions is automated between the light emitting element, the optical component, and the optical fiber, thereby completely solving the height tolerance caused by the inter-element wiring by using a fan out wafer level packaging (FOWLP) scheme.

In addition, in the present invention, the assembly of the optical transmission module, the optical fiber, and the optical component has a simple structure capable of being coupled with a minimum number of components through a minimum number of assembly processes.

Moreover, in the present invention, various electric elements as well as system-in-package (SiP) type optical elements may be integrated in the optical transmission module, and the size of the optical transmission module may be reduced.

In the present invention, an optical element and a driving chip are packaged without using a substrate in a Fan Out Wafer Level Package (FOWLP) manner using a semiconductor manufacturing process, so that an optical transmission module can be realized in a subminiature size of $\frac{1}{16}$ or so of the conventional art.

In addition, in the present invention, an optical fiber assembly channel having an open structure is integrally formed in a system-in-package (SiP) type optical transmission module to package an optical engine into a one-chip or a single element.

In the present invention, an optical fiber assembly channel of a pick-and-place type package may have a structure capable of automating an optical fiber assembly.

In addition, the present invention can provide an active optical cable (AOC) assembly (such as an optical interface connector) capable of transmitting and receiving a large amount of data at a very high speed and being slimmed with a thickness of 1 mm.

In the present invention, a physically detachable coupling can be provided to a mating port of a terminal, and electrical I/O interfacing or optical interfacing can be performed through an interface provided at the mating port.

In addition, in the present invention, an external connection terminal made of a solder ball is provided and ultra-high-speed and high-capacity data transfer can be performed between a PCB and another PCB, between a chip and another chip, between a PCB and a chip, and between a PB and a peripheral device.

A connector plug according to the present invention can be packaged in a form of a system-in-package (SiP), a system-on-chip (SoC), and a package-on-package (PoP), as a transponder chip having both an electro-optic conversion function and a photo-electric conversion function.

In addition, in the present invention, an active optical cable (AOC) can implement an external connection terminal to meet the data transmission standard such as a mini display port, a standard display port, a mini universal serial bus (USB), a standard USB, a PCI Express (PCIe), IEEE 1394 Firewire, Thunderbolt, lightning, and high-definition multimedia interface (HDMI), QSFP, SFP, CFP, etc.

BEST MODE FOR CARRYING OUT THE INVENTION

Figure 1A:
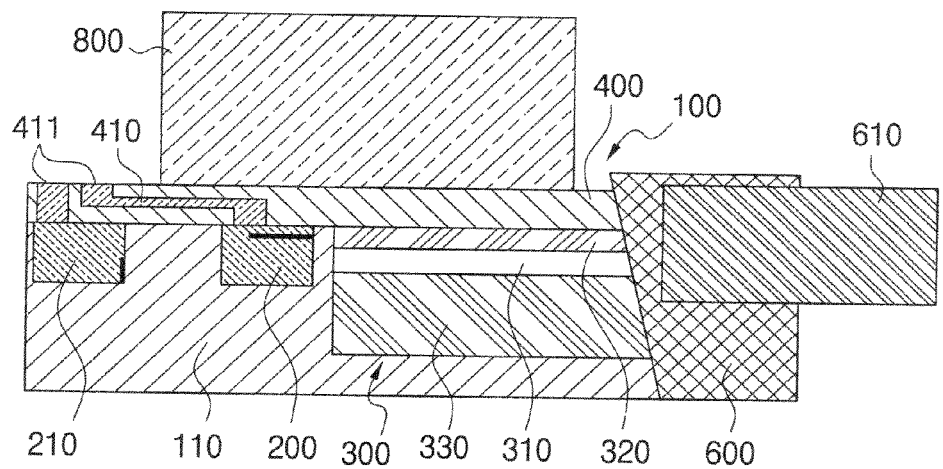
FIG. 1A is a longitudinal cross-sectional view of a driver-less optical transmission module according to an embodiment of the present invention.

Hereinafter, embodiments of the present invention will be described in detail with reference to the accompanying drawings. The sizes and shapes of the components shown in the drawings may be exaggerated for clarity and convenience.

Due to the price of the elements that convert electrical signals to optical signals and vice versa, optical communication systems are typically used as backbones in networks. However, optical communication systems can provide various advantages in computer communications. Computer communications refers to communications ranging from a few centimeters to hundreds of centimeters.

The present invention provides systems applicable to computer communications as well as an optical communication system used for optical communication between a terminal and another terminal which are located at a long distance from each other.

The optical communication system may use a semiconductor package that connects optical fibers to an optical transmission module (such as Transmitter Optical Sub-Assembly (TOSA)) or an optical reception module (such as Receiver Optical Sub-Assemble (ROSA)). An example of a light emitting element includes a distributed feedback laser (DFB laser), and an example of a light receiving element includes a photodiode (PD).

An optical component for performing a MUX function in an optical transmission module (such as TOSA) may use an Arrayed Waveguide Grating (AWG) having a single mode waveguide.

A driving circuit (i.e., a driving chip or optical IC) is used to operate according to an optical element. For example, a photodiode operates with a trans-impedance amplifier to amplify an electrical signal due to a collision of photons on the photodiode. In addition, in the case of a light emitting element, the driving circuit is used to drive the light emitting element.

In this invention, light emitting elements, monitor photodiodes, optical components that perform optical multiplexing functions, and the like are integrated without wire-bonding together with a driving circuit (driving chip) using a flip chip package technology, and at the same time, are packaged in a fan-out technology, so-called FOWLP (Fan Out Wafer Level Package) scheme, in which I/O terminals are pulled out while integrating elements without using a substrate, to thereby implement a slim optical transmission module while completely solving the height tolerance due to inter-element wiring.

In addition, an optical transmission module is manufactured by performing a manufacturing process using a semiconductor process in units of wafers, and then, subsequently, an optical fiber assembly guide for mounting an optical fiber may be integrally formed on one surface of the optical transmission module, and the optical fiber may be fixed by a dicing process individually separating the optical fiber to thereby obtain the optical transmission module in a semiconductor package type.

Further, in this invention, light emitting elements, monitor photodiodes, optical components that perform optical multiplexing functions, and the like are packaged by performing a flip chip package together with a variety of driving circuits (driving chips), to thereby form a slim optical transmission module, and at the same time, AWG is packaged together as an optical component, to thereby solve the assembly difficulty by automating optical alignment in all directions of x, y, and z between the light emitting element and the AWG.

In addition, three-dimensional (3D) optical alignment between the light emitting element and the optical component is automatically performed by integrally forming the light emitting element and the optical component on the optical transmission module wafer and integrally forming the optical fiber assembly guide required for optical fiber assembly, and alignment between optical components and optical fibers may be achieved without misalignment even if an inexpensive passive alignment technology is used without active alignment.

The present invention described below is mainly described with respect to the case that an optical transmission module such as a Transmitter Optical Sub-Assembly (TOSA) of a 100 G-class optical communication system performs an MUX function and the present invention may be applied to an optical reception module such as a Receiver Optical Sub-Assembly (ROSA) that performs a DEMUX function.

In the following detailed description, an optical fiber may refer to an optical fiber line from which a coating layer is removed from the optical fiber.

Figure 1B:
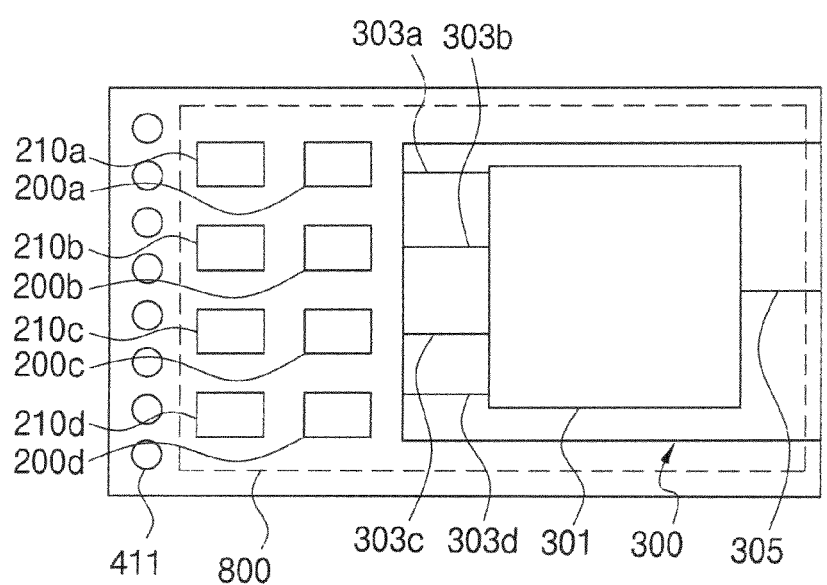
FIG. 1B illustrates an element layout of the optical transmission module shown in FIG. 1A.

As enclosed, FIG. 1A is a longitudinal cross-sectional view of a driver-less optical transmission module according to an embodiment of the present invention, and FIG. 1B illustrates an element layout of the optical transmission module shown in FIG. 1A.

Referring to FIGS. 1A and 1B, The driver-less optical transmission module (such as TOSA) 100 according to the present invention includes a light emitting element 200, a monitor photodiode 210, and an optical component 300 performing an optical multiplexing function inside a mold body 110. The mold body 110 may be made of a transparent molding material through which an optical signal may be transmitted, for example, an epoxy mold compound (EMC).

An optical fiber 610 is connected to one end of the optical transmission module (such as TOSA) 100 by using an optical connection member 600.

The optical component 300 may use, for example, an arrayed waveguide grating (AWG) having a single mode waveguide.

In the AWG, a plurality of input waveguides 303*a*-303*d* into which a plurality of optical signals incident from a plurality of light emitting elements 200*a*-200*d* are input are connected to the front end of an optical multiplexer unit 301 performing an optical multiplexing function, and one output waveguide 305 for outputting one optical signal output after the plurality of optical signals are multiplexed is connected to the rear end of the optical multiplexer unit 301.

Each of the plurality of input waveguides 303*a*-303*d* required for optical alignment with the plurality of light emitting elements 200*a*-200*d* includes an under cladding 310 and a core 320, and a portion of the top cladding may be replaced with a wiring layer 400.

In this case, the wiring layer 400 may be formed of polyimide or the like as an insulating layer. Inside and outside the wiring layer 400, there is a wiring metal 410 for connecting, with each other, elements that are encapsulated inside the mold body 110 and require electrical connection (e.g., light emitting element 200, monitor photodiode 210, etc.), and electrically connecting the inside and the outside of the wiring layer 400.

An external connection terminal 411 connected to the wiring metal 410 and the monitor photodiode 210 encapsulated in the mold body 110 is exposed to the surface of the wiring layer 400 so as to electrically connect the inner wiring layer 200, the light emitting element 200, and the like to the outside. The external connection terminal 411 may be in the form of a ball grid array using a wire-bonding pad or a solder ball.

In this case, the external connection terminal 411 may be configured to meet the data transmission standard such as a mini display port, a standard display port, a mini universal serial bus (USB), a standard USB, a PCI Express (PCIe), IEEE 1394 Firewire, Thunderbolt, lightning, and high-definition multimedia interface (HDMI), QSFP, SFP, CFP, etc.

The optical transmission module (such as TOSA) 100 according to the present invention may perform a wavelength multiplexer (WDM MUX) function for collecting signals of four channels having different wavelengths (frequencies) and transmitting them to one optical fiber 610, for example, so as to play a role as a 100 G-class optical transceiver.

For optical communication between a terminal and another terminal located at a long distance, the optical transmission module (such as TOSA) 100 according to the present invention may use an edge-type light emitting element through which light is emitted in an edge direction of a chip capable of long-distance transmission, as a light emitting element 200, and may use an arrayed waveguide grating (AWG) having a plurality of input waveguides 303a-303d as the optical component 300 to perform a wavelength multiplexer (WDM MUX) function.

In this case, the plurality of input waveguides 303a-303d may have a structure in which a core is inserted between under cladding and top cladding. In this case, the input waveguides 303a-303d of the AWG may be implemented by using a material having a lower refractive index than the core for under cladding and top cladding.

When top cladding is formed using SiON or $SiO_2$ in the input waveguides 303a-303d of the AWG, the height of the top cladding should be 15-20 μm or more. However, since the height of the optical axis (i.e., the light emitting spot) of a general edge type light emitting element, for example, a distributed feedback laser (DFB laser), is about 4 μm to 5 μm, The heights of the optical axes of the edge-type light emitting elements 200a-200d and the heights of the optical axes (i.e., the cores) of the input waveguides of the AWG are greatly different.

In general, considering that a solder layer existing between a printed circuit board (PCB) and a distributed feedback laser (DFB laser) is at least 10 μm when the DFB laser is mounted on the printed circuit board (PCB) by a soldering scheme, it is difficult to align the optical axes of the edge-type light emitting elements with the input waveguides of the AWG, by using passive alignment.

The distributed feedback laser (DFB laser) is equipped with a resonator that has wavelength selectivity by making the optical waveguide have a periodic structure, and has the same principle of light emission as that of ordinary semiconductor lasers. However, in order to equalize the wavelengths of light, irregularities are installed in the light emitting units, and the speed of light transmitted inside the optical fiber is also the same, so that the signal waveform does not collapse.

In the present invention, optical alignment in all directions x, y, and z is performed in a sub-micron unit between the edge-type light emitting elements 200a-200d and the input waveguides 303a-303d of the AWG.

Figure 9:
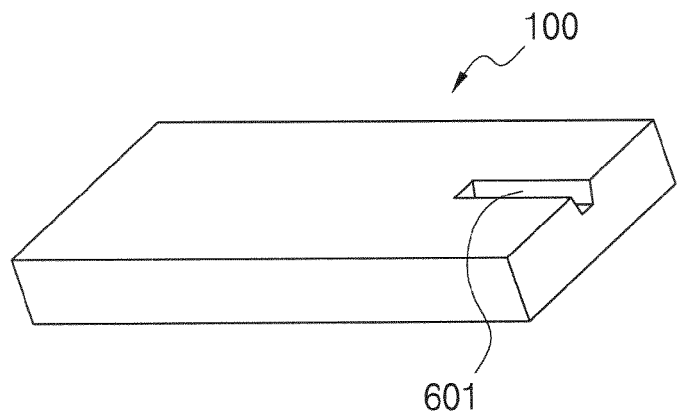
FIG. 9 is a perspective view illustrating an optical transmission module manufactured according to the present invention.

First, as illustrated in FIG. 9, in the x and y directions, sub-micron unit alignment is performed on a two-dimensional plane between four (4 channels) or 10 (10 channels) edge-type light emitting elements (200a-200d) and the input waveguides 303a-303d of the AWG, through precise pick and place equipment.

Thereafter, in the z direction (height direction), there is a tolerance of microns or more in the height itself between the edge-type light emitting elements 200a-200d and the input waveguides 303a-303d of the AWG, and the heights of the light emitting spots of the edge type light emitting elements are also different from the heights of the cores of the input waveguide 303a-303d. As a result, it is not possible to solve the optical alignment problem in the z direction with only a precise place of a chip.

In order to solve this problem, the present invention does not apply an additional process for changing the height of the edge type light emitting element. As illustrated in detail in FIGS. 1A and 8A to 8G, the AWG from which the top claddings of the input waveguides have been removed is first packaged, and then a material having a refractive index lower than that of the core 320 is used as a material of the wiring layer 400 so that the wiring layer 400 serves as top cladding, to thereby provide a method of overcoming a height difference between two elements.

In the present invention, as shown in detail in FIGS. 8A to 8G to be described later, when the light emitting elements 200 and various driving circuits (driving chips) are flip-chip-packaged, the AWG is packaged together. Accordingly, it is possible to automate optical alignment in the z direction as well as in the x and y directions between the light emitting element 200 and the optical component 300 (i.e., AWG), to thereby provide an optical transmission module 100 capable of solving assembly difficulty.

As a result, the AWG according to the present invention serves to transmit, for example, four channels of optical signals generated from a plurality of light emitting elements 200 embedded in the optical transmission module (such as TOSA) 100 to the optical fiber 610 by performing a wavelength division multiplexing (WDM) function. Accordingly, the optical transmission module (such as TOSA) 100 may realize a wavelength multiplexer (WDM MUX) having 100 Gbps (=25 Gbps×4 channels) per channel. In addition, the optical transmission module (such as TOSA) 100 may realize a wavelength multiplexer (WDM MUX) having 100 Gbps (=10 Gbps×10 channels) per channel.

In FIGS. 1A and 1B, a plurality of monitor photodiodes 210 or 210a-210d are embedded and arranged at the rear end of the light emitting element 200. The monitor photodiode 210 monitors the amount of light generated when the light emitting element 200 operates and transmits a detection signal for determining whether the optical transmission module (such as TOSA) 100 fails to a system control unit through the external connection terminal 411.

In the optical transmission module 100 of the present invention, an optical connection member 600 may be used to connect the optical transmission module 100 and the optical fiber 610. A heat dissipation member 800 is attached to the upper or lower surface of the light transmission module 100, and the light transmission module 100 may have a heat dissipation function when heat is generated from the light emitting element 200, a driver IC 220, or the like.

Here, the optical connection member 600 may use, for example, a hardware connector of the QSFP, and the heat dissipation member 800 may include a thermo-electric cooler (TEC), a metal block, or the like.

In this case, a wiring metal 410 and a vertical conductive path 412 embedded in the wiring layer 400 provide a method capable of efficiently transferring heat generated from internal elements to the heat dissipation member 800 (the TEC, heat dissipation block, etc.) that may be installed on the surface.

As described above, in the present invention, when the light emitting element 200 and the AWG are packaged in a flip chip packaging scheme that does not use a substrate, The mold body 110 is formed in a state where the AWG from which the top cladding of the input waveguide is removed is position-set to the same level as the light emitting element 200, and a material having a refractive index lower than that of the core 320 is used as the material of the wiring layer 400 to serve as a top cladding and an insulating layer. Accordingly, the assembly difficulty may be solved by automating optical alignment in all directions of x, y, and z between the light emitting element 200 and the optical component 300 performing optical multiplexing.

In the aforementioned embodiment, the AWG serving as an example of performing a wavelength division multiplexing (WDM) function and transmitting multiple channels of optical signals to the optical fiber as the optical component 300 has been described, but this invention is not limited thereto.

The optical component 300 may include an input waveguide and may process or transmit light. Accordingly, the optical component 300 may include a modulator having an input waveguide, that is, a Mach-Zehnder interferometer (MZI) or a ring modulator in addition to an optical multiplexer having an input waveguide. In this case, the optical component 300 does not modulate a signal by adjusting the amount of light of the laser, but the optical element modulates the signal.

In addition, the optical component 300 may include an element in which a modulator and a multiplexer (MUX) function are simultaneously implemented in one element.

As another example, the optical component may be used as an element for optical beam formation and as a component for a vehicle Lidar, and the optical element may include a splitter for splitting light having the same wavelength.

Figure 2:
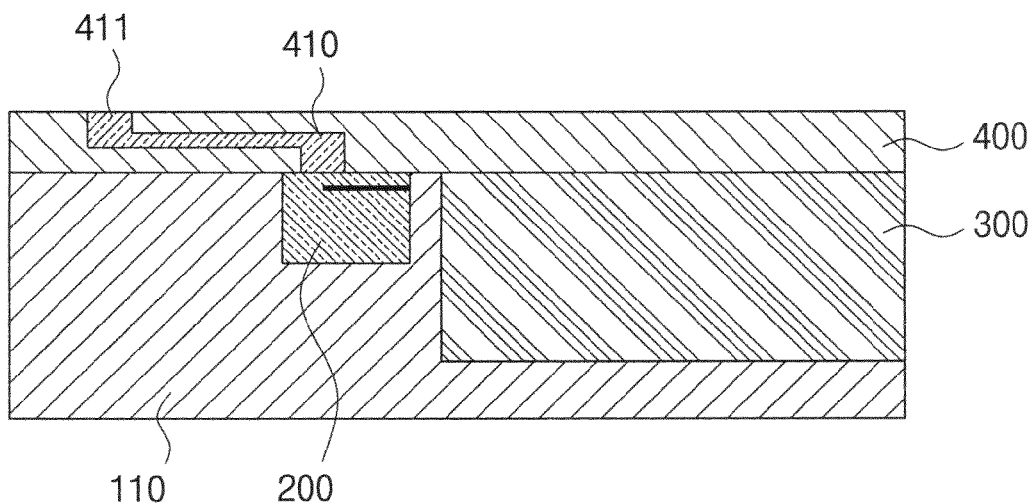
FIG. 2 is a cross-sectional view illustrating essential elements of a driver-less optical transmission module according to a first embodiment of the present invention.

FIG. 2 is a cross-sectional view illustrating essential elements of a driver-less optical transmission module according to a first embodiment of the present invention.

In the driver-less optical transmission module 100 according to the first embodiment, the light emitting element 200 and the optical component 300 are arranged on the same plane of the lower end of the wiring layer 400. That is, the light emitting spot of the light emitting element 200 and the core of the input waveguide of the optical component 300 are arranged on the same plane of the lower end of the wiring layer 400 so that the optical axes of the light emitting element 200 and the optical component 300 are automatically aligned.

The light emitting element 200 and the optical component 300 are arranged adjacent to each other and are embedded in the mold body 110 formed by being encapsulated with a molding material through which an optical signal may be transmitted.

In this case, the mold body 110 may be composed of two or more layers, and a material having a high transmittance with respect to a corresponding wavelength may be used in a region between the light emitting element 200 and the optical component 300 through which the optical signal is transmitted, and an opaque material may be used for the rest.

The wiring layer 400 uses an insulating material, and a polymer material such as polyimide, oxide, or the like may be used. The wiring layer 400 includes a wiring metal 410, which is responsible for a connection between a chip and another chip inside a package, a connection between a chip and an optical component, and a connection between a chip and an external electrical element.

The external connection terminal 411 has a structure connected to the internal wiring metal 410 and is responsible for connecting to the outside of the chip. The external connection terminal 411 may include a pad type capable of wire-bonding or a BGA type.

Figure 4:
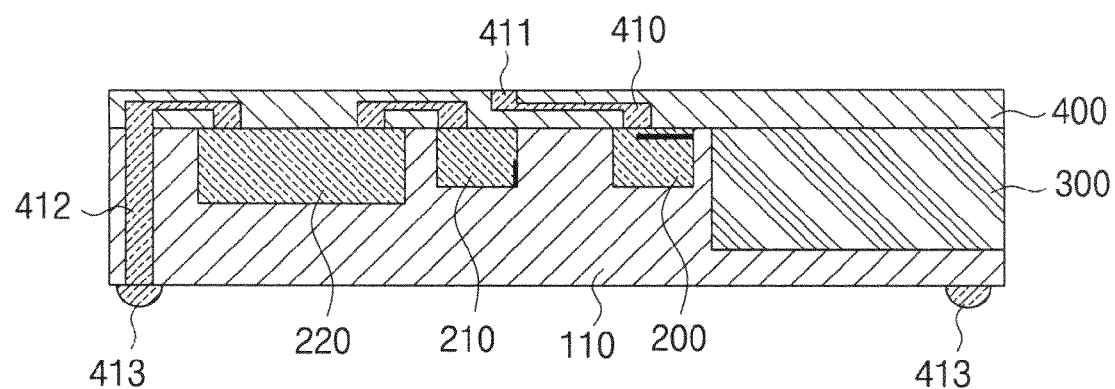
FIG. 4 is a cross-sectional view of a driver-embedded optical transmission module according to a third embodiment of the present invention.

In addition, as illustrated in FIG. 2, an optical transmission module (such as a driver-less TOSA) 100 that does not include a control IC receives an electrical signal provided by the control IC and converts the received electrical signal to an optical signal. The electrical signal at this time is provided in a form capable of directly generating an optical signal. However, as shown in FIG. 4, the optical transmission module including the control IC provides an electrical signal suitable for an input unit of the internal control IC. In both cases, the output signal of the optical transmission module is output in the form of an optical signal.

Figure 3:
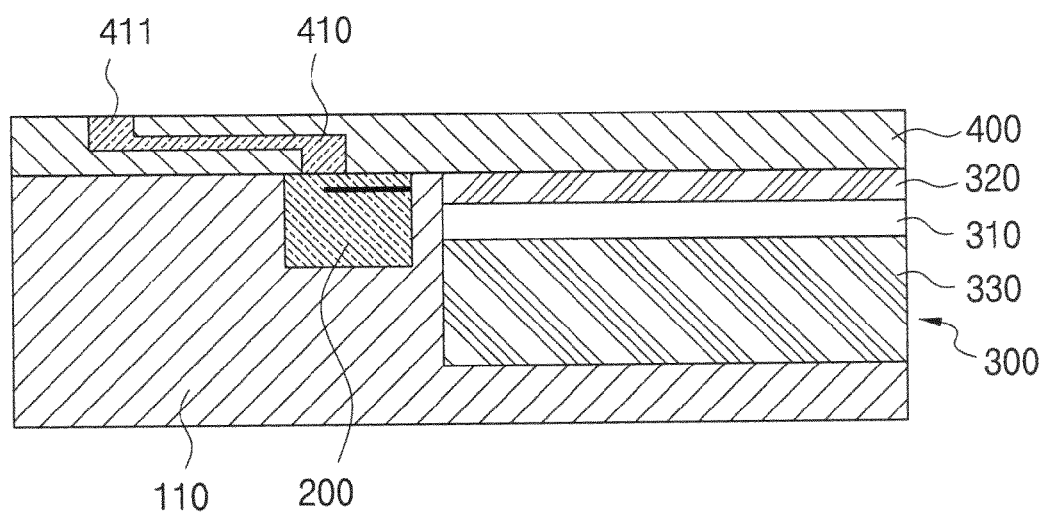
FIG. 3 is a cross-sectional view of a driver-less optical transmission module according to a second embodiment of the present invention in which the optical axes of a light emitting element and an optical component have different heights.

FIG. 3 illustrates a driver-less optical transmission module according to a second embodiment of the present invention in which the optical axes of a light emitting element and an optical component have different heights.

The driver-less optical transmission module 100 according to the second embodiment of the present invention removes or reduces the top cladding constituting the input waveguide of the AWG, which is the optical component 300, to match the optical axis heights of the core 320 and the light emitting element 200.

The optical component 300 uses an arrayed waveguide grating (AWG) having a plurality of input waveguides, and The input waveguide may be configured in a structure in which under cladding 310 and a core 320 are sequentially formed on the silicon substrate 330. In this case, the input waveguide of the AWG may be implemented using a material having a lower refractive index than the core.

In this case, the optical axis heights of the core 320 of the AWG and the light emitting element 200 may not be exactly the same and may vary in consideration of the diffusion path of light. The role of insufficient top cladding may be performed by the wiring layer 400 stacked on the surface of the optical component 300.

FIG. 4 illustrates a driver-less optical transmission module according to a third embodiment.

The driver-less optical transmission module according to the third embodiment includes: the driver IC 220 for driving and controlling the light emitting element 200 as an element to be packaged in the mold body 110; the monitor photodiode (mPD) 210 monitoring the amount of light of the light emitting element 200; and a wiring layer 400 connecting the light emitting element 200, the monitor photodiode (mPD) 210, and the driver IC 220.

As shown in FIG. 4, the optical transmission module (such as TOSA) 100 according to the present invention may include various driving circuits (driving chips) in addition to the driver IC 220 in the mold body 110.

In the present invention, it is possible to manufacture a single semiconductor package in which various devices are integrated together without limitation as well as the light emitting element 200 and the optical component 300 using a system-in-package (SiP) scheme.

For example, these elements may include SERialization/DE-serialization (SERDES), laser control ICs, microcontroller units (MCUs), central processing units, error correction elements, and the like. These elements are connected to each other by the wiring layer inside the package without wire bonding.

The optical transmission module 100 of the third embodiment may include an external connection terminal 411 positioned on the wiring layer 400 and another external connection terminal 413 positioned on the opposite surface of the wiring layer 400, for connection with the outside.

In this case, a vertical conductive path 412 in a vertical direction is used to connect the wiring layer 400 and the opposite surface. The vertical conductive path 412 may directly pass through the mold body 110 or may be included in another structure to be connected thereto. The external connection terminal 413 may have a BGA shape formed of a solder ball.

Next, a method and apparatus for connecting the optical transmission module and the optical fiber will be described. In this case, the optical transmission module includes all of the above-described examples.

Figure 5:
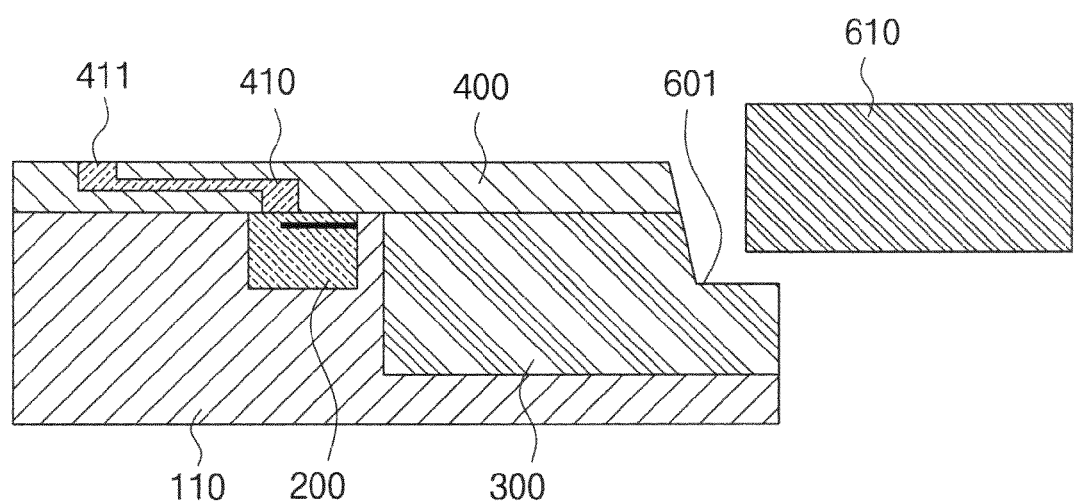
FIG. 5 is a cross-sectional view of a driver-less optical transmission module having an optical fiber assembly guide formed therein capable of accommodating optical fibers in the optical transmission module.

As an example, in FIG. 5, an optical fiber assembly guide 601 capable of accommodating the optical fiber 610 is made by etching a portion of the optical transmission module 100.

When the substrate of the optical component 300 is made of Si, anisotropic etching is possible, and thus a desired shape may be precisely manufactured.

Figure 6:
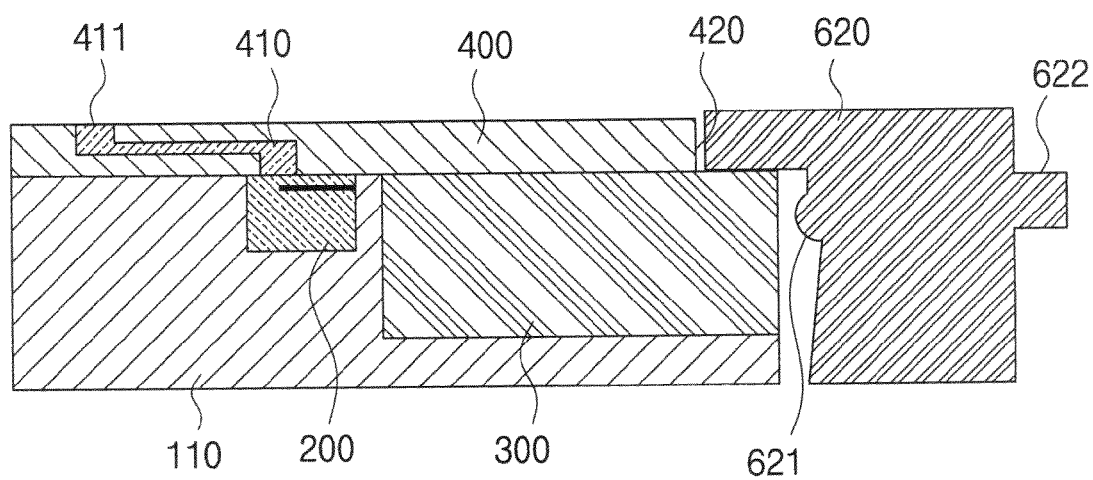
FIG. 6 is a cross-sectional view of a driver-less optical transmission module using an optical fiber alignment member helping optical fiber alignment.

As another example, in FIG. 6, an optical fiber alignment member 620 that helps optical fiber alignment may be used. A guide pin 622 is provided in the optical fiber alignment member 620 to be easily coupled to the optical fiber block in which the optical fiber is accommodated without directly inserting the optical fiber. In addition, in order to align the optical fiber alignment member 620 and the optical transmission module 100, they may be aligned using a structure on the wiring layer 400 or an upper portion of the wiring layer. A lens 621 for helping optical alignment may be added to the optical fiber alignment member 620. The lens 621 may be a collimate lens for focusing incident light.

Figure 7:
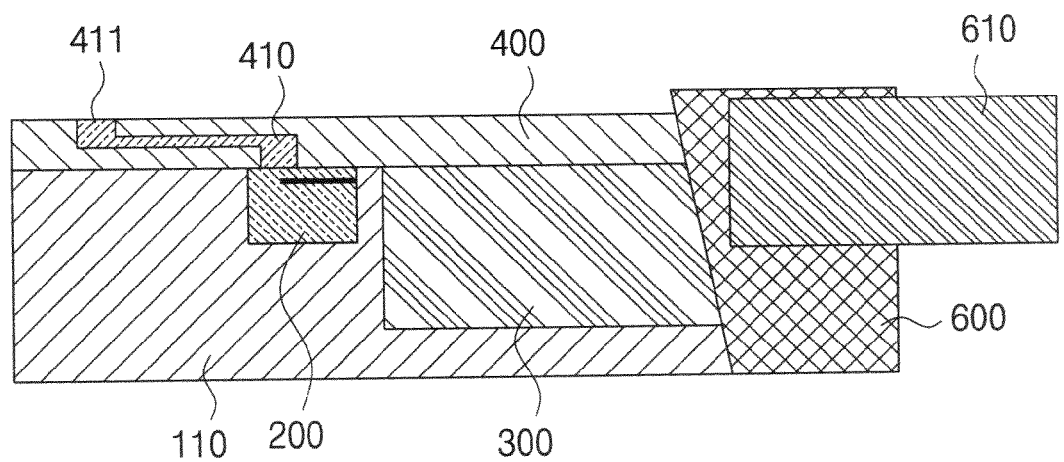
FIG. 7 is a cross-sectional view of a driver-less optical transmission module in which an optical fiber block accommodating an optical fiber is directly coupled to the optical transmission module.

As another example, in FIG. 7, the optical fiber block 600 in which the optical fiber 610 is accommodated is directly coupled to the optical transmission module 100. In this case, the optical fiber block 600 and the optical transmission module 100 may be aligned by using the wiring layer 400 of the optical transmission module 100 or the structure above the wiring layer, or the two structures may be brought into contact with each other and then may be aligned using an active optical alignment scheme.

Hereinafter, a method of manufacturing an optical transmission module using a semiconductor packaging scheme according to the present invention will be described with reference to FIGS. 8A to 8G.

The semiconductor packaging of the optical transmission module 100 according to an embodiment of the present invention starts with placing, on a flat surface, a portion having a constant height between the surface of an optical element, that is, the light emitting element 200, and the optical axis of the AWG chip 300, which is the optical component 300. Accordingly, the height alignment in the z-axis direction may be performed between the light emitting element 200 and the optical component 300.

In the conventional art, this method is difficult because an electrical connection part (terminal pad) for electrical connection should be added to a portion having a constant height, and a tolerance with respect to the height may occur due to a soldering part of the electrical connection part (terminal pad).

In this invention, a height tolerance due to wiring between elements can be completely solved by using a Fan Out Wafer Level Packaging (FOWLP) scheme of reconstructing the elements in a wafer shape and wiring on the elements using a semiconductor wiring process, in the electrical connection part between the elements.

Figure 8A:
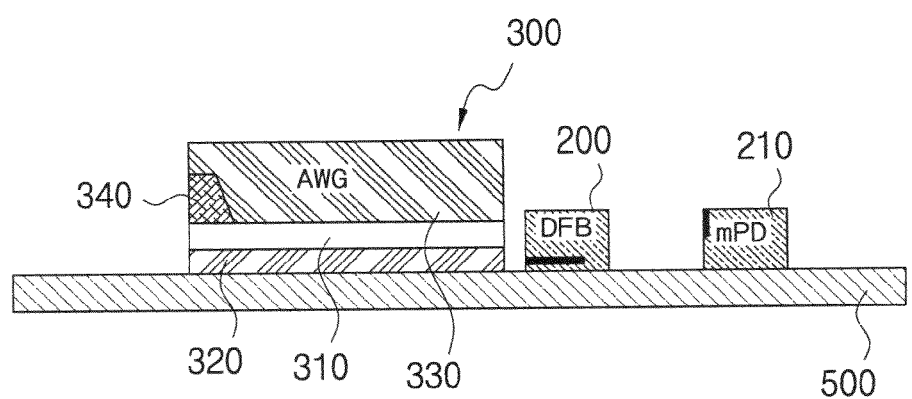
FIGS. 8A to 8G are process cross-sectional views illustrating a method of manufacturing a driver-less optical transmission module according to the present invention.

In the process of manufacturing the optical transmission module using the semiconductor packaging scheme according to the present invention, first, as shown in FIG. 8A, by using pick and place equipment, chips to be packaged on a carrier 500 with an adhesive coated thereon, for example, the light emitting element 200, the monitor photodiode 210, and the optical component 300 performing an optical multiplexing function, as shown in FIG. 1B, are positioned at desired positions. A distributed feedback laser (DFB laser) may be used as the light emitting element 200, and an arrayed waveguide grating (AWG) may be used as the optical component 300.

The AWG uses a chip in which only the under cladding 310 and the core 320 are formed on a silicon substrate 330 and the top cladding is not formed among elements forming the input waveguides to match the optical axis height with the DFB laser.

Figure 8B:
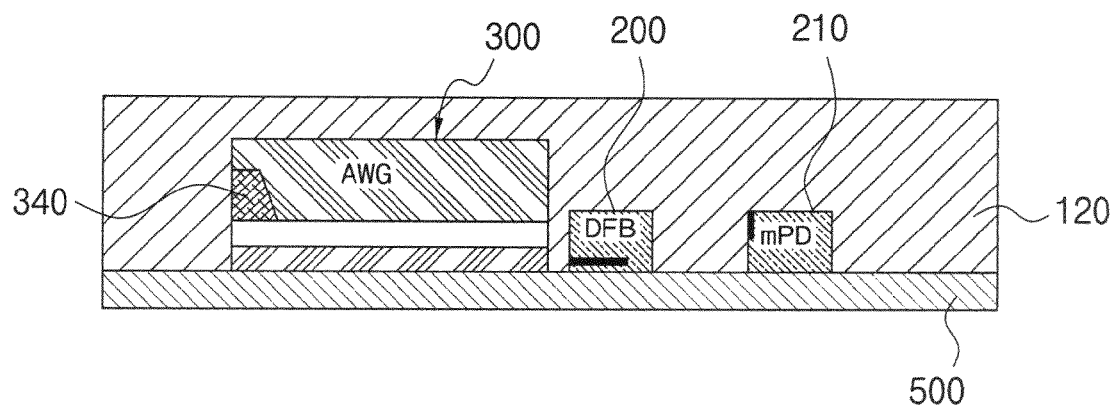
Figure 8C:
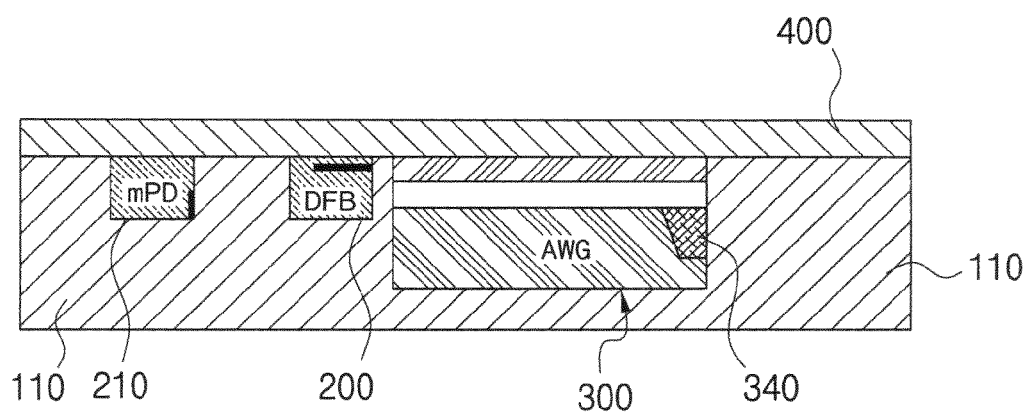
Figure 8D:
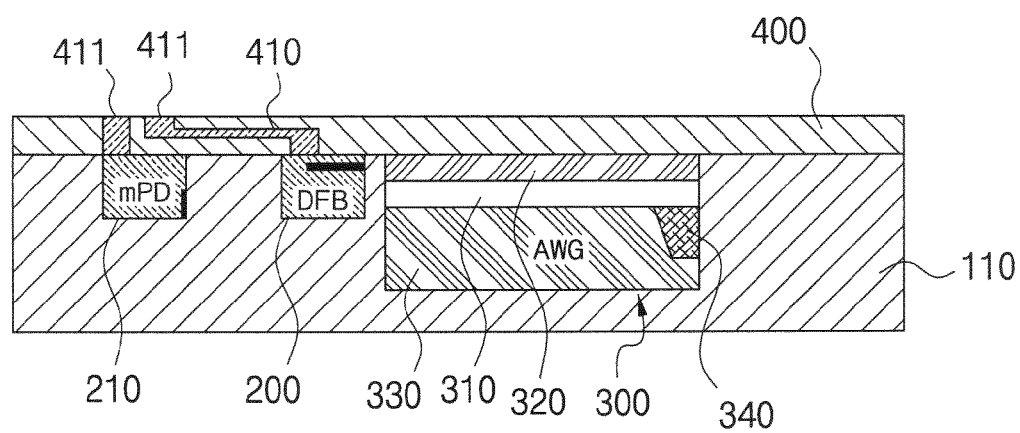
Figure 8E:
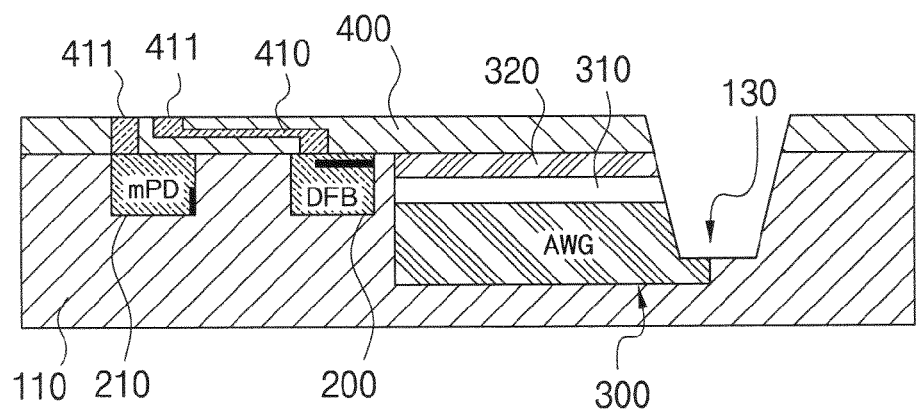
Figure 8F:
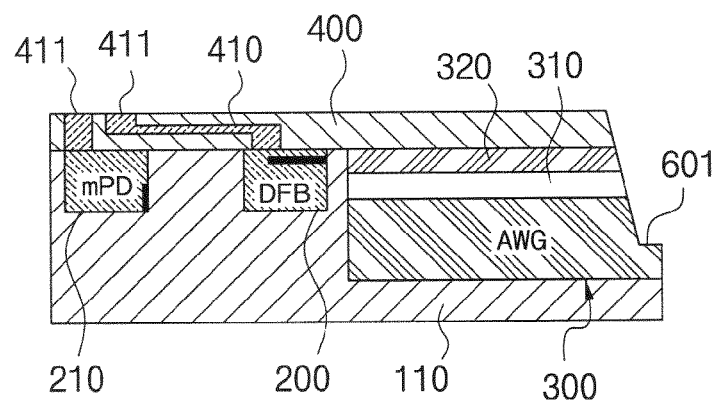

When an optical fiber assembly guide 601 for accommodating optical fibers is formed in a subsequent process as shown in FIG. 8F, a temporary filling material 340 capable of easily etching during anisotropic etching may be filled in one side of the silicon substrate 330 of the AWG.

Figure 8G:
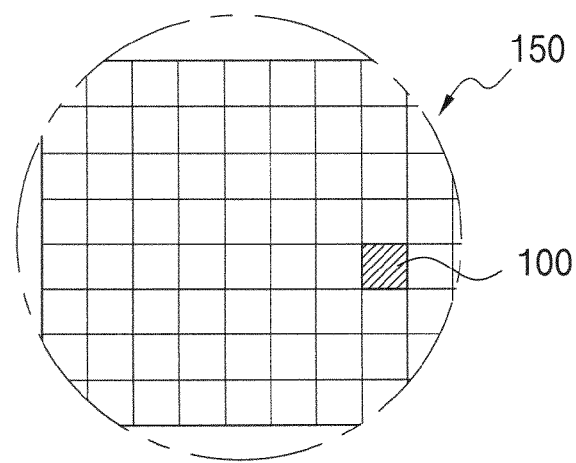

Various chip-type components to be integrated in the optical transmission module 100 through a flip chip process are attached to preset positions using the carrier 500. As shown in FIG. 8G, the carrier 500 may be formed in the form of a wafer so that a manufacturing process may proceed to the wafer level.

Various components to be integrated in the optical transmission module 100 include a driver IC 220, a via PCB necessary for forming a vertical conductive path 412, SERrialization/DE-Serialization (SERDES), a laser control IC, a microcontroller unit (MCU), a central processing unit (CPU), and an error correction element, in addition to the light emitting element 200, the monitor photodiode 210, and the optical component 300, and mounted in the pick and place scheme. The mounting direction of the mounted component is determined so that the connection pad of the chip contacts the carrier 500.

The via PCB may form a through hole by penetrating a PCB with a laser or by using a patterning process and an etching process on the PCB, and fill the through hole with a conductive metal to thereby form the vertical conductive path 412. The conductive metal may be formed of a metal such as gold, silver, or copper, but is not limited thereto and may be a conductive metal. In addition, the method of forming the vertical conductive path 412 in the through hole may include filling the through hole with the conductive metal by sputtering, evaporation, or plating, and then planarizing the surface of a substrate, in addition to the method of filling the conductive metal powder.

Subsequently, as shown in FIG. 8B, the molding layer 120 is formed by applying, a molding material, for example, an epoxy mold compound (EMC) to an upper part of the carrier 500, and then the surface is planarized after curing. Subsequently, the upper surface of the cured mold is processed by chemical mechanical polishing (CMP) to expose the upper end of the vertical conductive path 412 (not shown in FIG. 8B), and then the cured mold and the carrier 500 are separated to thus obtain a slim mold body 110, as shown in FIG. 8C. The process of FIG. 8B may be performed in units of wafers.

The mold body 110 is preferably made of a transparent molding material, for example, the epoxy mold compound (EMC), through which an optical signal generated from the light emitting element 200 may be transferred to the monitor photodiode 210 and the optical component 300.

Subsequently, the obtained wafer-shaped mold is inverted as shown in FIG. 8C, and an insulating material for protecting the connection pad between the exposed light emitting element 200 and the monitor photodiode 210 is applied to form the wiring layer 400 as shown in FIG. 8D.

In this case, the insulating material used to form the wiring layer 400 may include, for example, polyimide, poly(methyl methacrylate) (PMMA), benzocyclobutene (BCB), silicon oxide ($SiO_2$), acrylic, or other polymer-based insulating materials.

In this case, the wiring layer 400 may be configured to replace, by using polyimide, for example, a top cladding function omitted from the input waveguide of the AWG. Since the top cladding of the input waveguide is implemented using a material having a lower refractive index than the core, the material of the wiring layer 400 should be selected in consideration of this. However, it is also possible to use a material having a lower refractive index than the core only for the top cladding portion of the input waveguide and the other insulating materials having a higher refractive index than the core for the rest.

Subsequently, as shown in FIG. 8D, a wiring metal 410 is formed in the wiring layer 400 to electrically connect the elements or chips. First, an insulating material for protecting the connection pad of the exposed light emitting element 200 and the monitor photodiode 210 is applied to form the wiring layer 400, and then a contact window with respect to the connection pad is formed.

Subsequently, a conductive metal layer is formed and patterned to form a conductive wiring metal 410 interconnecting the terminal pads of each element. The wiring metal 410 may be manufactured by forming a conductive metal layer by a method such as sputtering or evaporation with a conductive metal such as gold, silver, copper, or aluminum.

Thereafter, an insulating material covering the conductive wiring metal 410 is formed, and a plurality of contact windows are opened as shown in FIG. 1B to form an external connection terminal 411. The external connection terminal 411 may be variously modified according to a data transmission standard specification, and may be in the form of a ball grid array using a wire-bonding pad or a solder ball.

Subsequently, as shown in FIG. 8E, the wiring layer 400, the front end of the output waveguide, and the portion filled with the temporary filling material 340 are anisotropically etched to form an optical fiber storage space 130. The optical fiber storage space 130 is required to form an optical fiber assembling guide 601 for storing the optical fiber 610 in the subsequent process.

Subsequently, as shown in FIGS. 8F and 8G, the lower end of the optical fiber storage space 130 is wafer-sawed in the optical transmission module wafer 150 and separated into individual packages.

The optical transmission module 100 separated into individual packages as described above has an optical fiber assembly guide 601 formed on one side surface of the package to insert a single optical fiber 610 as shown in FIG. 9.

As described above, the optical transmission module 100 of the present invention may be packaged in a slim form by packaging the light emitting element 200, the monitor photodiode 210, and the optical component 300 performing an optical multiplexing function, without using a substrate in a fan out wafer level package (FOWLP) scheme using a semiconductor manufacturing process.

In addition, a three-dimensional (3D) optical alignment between the light emitting element 200 and the optical component 300 is automatically achieved by integrally forming the light emitting element 200 and the optical component 300 on the optical transmission module wafer 150 in the fan out wafer level package (FOWLP) scheme, and integrally forming the optical fiber assembly guide 601 required for optical fiber assembly. Alignment between the optical light emitting elements 200 and the optical components 300 may be achieved without misalignment even if an inexpensive passive alignment technology is used without active alignment.

While the present invention has been particularly shown and described with reference to exemplary embodiments thereof, by way of illustration and example only, it is clearly understood that the present invention is not to be construed as limiting the present invention, and various changes and modifications may be made by those skilled in the art within the protective scope of the invention without departing off the spirit of the present invention.

INDUSTRIAL APPLICABILITY

In the present invention, an optical transmission module may be configured by using a manner in which passive alignment between a light emitting element and an optical component may be easily performed, and may transmit and receive large amounts of data at ultra-high speeds ranging from hundreds of giga to tens of tera or more. Accordingly, the present invention can be applied to active optical cables (AOCs) used for data transmission between boards and boards of hyper blade servers and between UHD TV-class TVs and peripherals.

What is claimed is:

1. An optical transmission module comprising:
a mold body having a first surface and a second surface opposite to the first surface;
a plurality of edge-type light emitting elements, each of which is molded inside the mold body by fitting same to the first surface so as to match with the first surface and generates an optical signal in an edge direction of a chip; and
an optical component disposed on one side of the plurality of edge-type light emitting elements and molded inside the mold body, the optical component optically multiplexes a plurality of optical signals incident from the plurality of edge-type light emitting elements and to output a multiplexed optical signal,
wherein the optical component includes an arrayed waveguide grating (AWG) which includes, on one side thereof, a plurality of input waveguides corresponding to the plurality of edge-type light emitting elements, and optically multiplexes the plurality of optical signals incident through the plurality of input waveguides and outputs the multiplexed optical signal through an output waveguide, and
each of the light emitting elements has an optical axis height set to be the same as a core of each of the input waveguides.

2. The optical transmission module of claim 1, wherein the AWG includes:
an optical multiplexer unit that performs an optical multiplexing function;
the plurality of input waveguides connected to a front end of the optical multiplexer unit and to which the plurality of optical signals incident from the plurality of light emitting elements are input; and
a single mode output waveguide that is connected to a rear end of the optical multiplexer unit and outputs the multiplexed optical signal after the plurality of optical signals are multiplexed.

3. The optical transmission module of claim 1, further comprising: a wiring layer formed of an insulating material on the first surface of the mold body and including upper parts of the cores of the plurality of input waveguides, thereby serving as a top cladding to the plurality of input waveguides,
wherein the plurality of input waveguides of the AWG are molded inside the first surface of the mold body with no top cladding.

4. The optical transmission module of claim 3, wherein the wiring layer formed in a top cladding portion of each of the input waveguides is formed by using a material having a refractive index lower than those of the cores of the input waveguides.

5. The optical transmission module of claim 1, further comprising:

a wiring layer formed of an insulating material on the first surface of the mold body;

a wiring metal which is formed inside the wiring layer and connects the light emitting elements encapsulated in the mold body to outside of the wiring layer; and an external connection terminal exposed on a surface of the wiring layer and connected to the light emitting elements encapsulated inside the mold body through the wiring metal.

6. The optical transmission module of claim 5, wherein the external connection terminal is in the form of a ball grid array using a wire-bonding pad or a solder ball.

7. The optical transmission module of claim 1, further comprising:
a plurality of monitor photodiodes which are embedded at a rear end of the plurality of light emitting elements and generate detection signals for determining whether the optical transmission module fails by monitoring an amount of light generated when the light emitting elements operate.

8. The optical transmission module of claim 1, wherein the optical component performs a wavelength multiplexer (WDMMUX) function for collecting signals of a plurality of channels having different wavelengths and transmitting the collected signals to one optical fiber.

9. The connector plug of claim 1, wherein the height between the surface of each of the light emitting elements and the optical axis of the optical component is set to be the same, and the edge direction of the chip is parallel to the first surface of the mold body.

10. An optical transmission module comprising:
a mold body having a first surface and a second surface opposite to each other;
a plurality of edge-type light emitting elements, each of which is molded inside the first surface of the mold body and generates an optical signal in the edge direction of a chip;
an arrayed waveguide grating (AWG) which is molded in the first surface of the mold body and includes, on one side thereof, a plurality of input waveguides corresponding to the plurality of edge-type light emitting elements, and optically multiplexes a plurality of optical signals incident through the plurality of input waveguides and outputs same through an output waveguide, and
a wiring layer formed of an insulating material on the first surface of the mold body, wherein
the AWG is molded inside the first surface of the mold body without top cladding with the input waveguide, and
the wiring layer is formed of an insulating material on the first surface of the mold body including the upper parts of the cores of a plurality of input waveguides, thereby serving as top cladding to the input waveguides.

11. The optical transmission module of claim 10, wherein the plurality of edge-type light emitting elements are distributed feedback lasers (DFB lasers), and
the optical axis height of each of the DFB lasers is set to be the same as the core of each of the input waveguides, and the edge direction of a DFB laser chip is parallel to the first surface of the mold body.

12. The optical transmission module of claim 10, further comprising:
an optical fiber assembly guide formed to correspond to the output waveguide on the first surface of the mold body and to mount an optical fiber.

13. The optical transmission module of claim 10, further comprising:
an external connection terminal formed on the second surface of the mold body and electrically connected to the outside; and
a vertical conductive path formed through the mold body and electrically connected to the external connection terminal, wherein
the vertical conductive path is connected to each of the light emitting elements through the wiring layer.

14. The optical transmission module of claim 10, further comprising:
an optical fiber block coupled to one end of the optical transmission module in correspondence to the output waveguide and accommodating the optical fiber, wherein
the optical fiber block aligns the optical fibers by using the wiring layer to correspond to the output waveguide.

15. The optical transmission module of claim 10, wherein height tolerance caused by wiring between the elements is removed by using a fan out wafer level packaging (FOWLP) scheme.

16. A method of manufacturing an optical transmission module, the method comprising the steps of:
attaching a light emitting element is applied, and an arrayed waveguide grating (AWG) in which a top cladding of an input waveguide is not formed so as to match the height of the optical axis of the AWG with that of the light emitting element to predetermined positions on a carrier on which an adhesive;
forming a molding layer on top of the carrier with an epoxy mold compound (EMC) and flattening the surface after curing;
after performing a chemical mechanical polishing (CMP) process on the upper surface of the cured mold, obtaining a mold body having a first surface and a second surface facing each other by separating the cured mold and the carrier;
exposing the first surface in which a terminal pad of the light emitting element and a core of an input waveguide of the AWG are located by inverting the mold body; and
forming a wiring layer made of an insulating material on the first surface of the mold body, wherein
the wiring layer formed on top of the core of the input waveguide uses a material having a lower refractive index than the core of the input waveguide to serve as the top cladding of the input waveguide.

17. The method of manufacturing an optical transmission module of claim 16, wherein the height of the light emitting spot of the light emitting element is set to the same height as the core of the input waveguide.

18. The method of manufacturing an optical transmission module of claim 16, further comprising the step of:
forming an external connection terminal connected to the light emitting element through the wiring layer and formed on the first or second surface of the mold body to be electrically connected to the outside.

19. The method of manufacturing an optical transmission module of claim 16, further comprising the steps of:
etching the front end of an output waveguide of the AWG to form an optical fiber storage space; and
forming an optical fiber assembly guide capable of inserting an optical fiber into one side of an optical transmission module package by wafer sawing the lower end of an optical fiber accommodating space in an optical transmission module wafer.

\* \* \* \* \*